United States Patent [19]

Pollock et al.

[11] Patent Number: 4,740,746
[45] Date of Patent: Apr. 26, 1988

[54] CONTROLLED IMPEDANCE MICROCIRCUIT PROBE

[75] Inventors: Ira G. Pollock, Beaverton; Jon C. Manor, Aloha, both of Oreg.

[73] Assignee: Tektronix, Inc., Beaverton, Oreg.

[21] Appl. No.: 18,729

[22] Filed: Feb. 24, 1987

Related U.S. Application Data

[63] Continuation of Ser. No. 670,090, Nov. 13, 1984, abandoned.

[51] Int. Cl.$^4$ .................. G01R 1/06; G01R 31/02
[52] U.S. Cl. ....................... 324/158 P; 324/72.5; 324/73 PC; 324/158 F
[58] Field of Search .......... 324/158 F, 158 P, 73 PC, 324/72.5, 149, 158 R; 339/108 TP; 439/476

[56] References Cited

U.S. PATENT DOCUMENTS

| | | | |
|---|---|---|---|
| 4,116,523 | 9/1978 | Coberly et al. | 324/158 P |
| 4,355,857 | 10/1982 | Hayward | 339/177 R |
| 4,383,217 | 5/1983 | Shiell | 324/158 F |
| 4,593,243 | 6/1986 | Lao et al. | 324/158 F |
| 4,636,722 | 1/1987 | Ardezzone | 324/158 F |

FOREIGN PATENT DOCUMENTS

| | | |
|---|---|---|
| 0137370 | 4/1985 | European Pat. Off. . |
| 2924262 | 2/1981 | Fed. Rep. of Germany ... 324/158 P |
| 2066590 | 7/1981 | United Kingdom . |
| 2113483 | 8/1983 | United Kingdom . |

OTHER PUBLICATIONS

"Tester Contact Method", by Kappel et al., IBM Tech. Disc. Bull., 2/79, vol. 21, #9, p. 3742.
"Gigahertz Probl. Assembly", by Beers, IBM Tech. Disc. Bull., 9/72, vol. 15, #4, p. 1144.
"A Coaxial Test Probe", by Abbatecola et al., IBM Tech. Disc. Bull., 12/69, vol 12, #7, p. 1061.
"Probe for MOS Measurements", by Hoepstra, IBM Tech. Disc. Bull., 3/71, vol. 13, #10, p. 2981.
"Probe Head for Tester", Zak et al., Aug. 1971, IBM Tech. Discl. Bull., vol 14, #3, p. 756.
"High Performance Contactor", Bove, Feb. 1976, IBM Tech. Disc. Bull., vol. 18, #9, p. 2883.

Primary Examiner—Reinhard J. Eisenzopf
Assistant Examiner—W. Burns
Attorney, Agent, or Firm—John P. Dellett; Francis I. Gray; Boulden G. Griffith

[57] ABSTRACT

A probe for coupling electrical test equipment to a selected point of an electrical device has a resiliently supported rigid pin for contacting the selected point and a wave guide of substantially constant characteristic impedance coupling the test equipment to the pin.

4 Claims, 2 Drawing Sheets

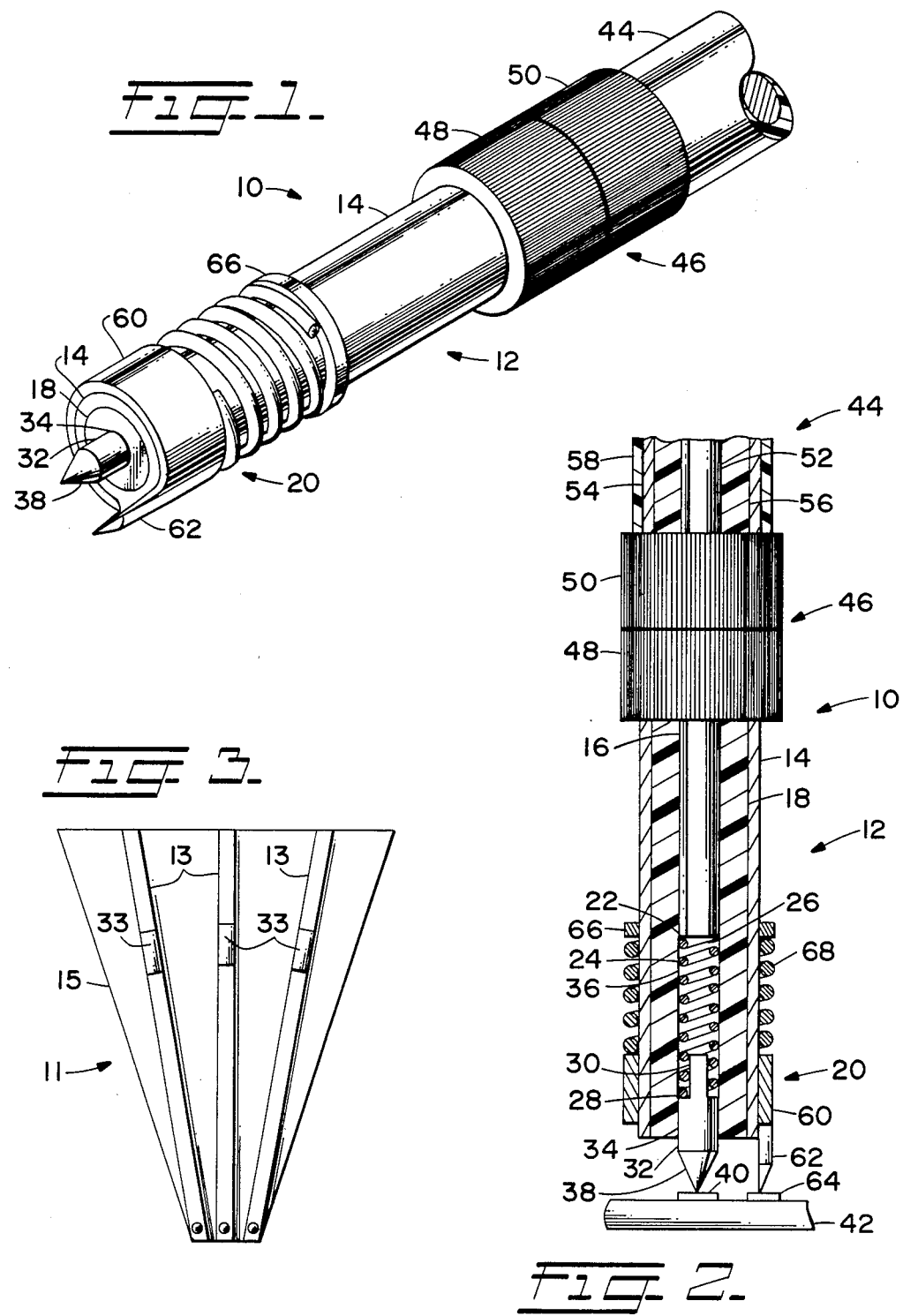

CONTROLLED IMPEDANCE MICROCIRCUIT PROBE

This is a continuation of application Ser. No. 670,090 filed Nov. 13, 1984 and now abandoned.

BACKGROUND OF THE INVENTION

The present invention relates to devices for measurement of electrical circuits and particularly to probes for making direct, temporary contact to selected points on microcircuits.

Microcircuit probes are used to provide temporary electrical connections between test equipment and selected points, usually bonding pads, on integrated circuit (IC) devices. A microcircuit probe should provide good electrical contact without applying excessive pressure to the IC device. Also, the probe should present a constant characteristic impedance path from the bonding pad of the microcircuit to the point of connection of the probe with the measurement equipment, particularly when used in measurement of IC devices operating in the microwave frequency range. A discontinuity can cause unwanted signal reflections at the point of discontinuity resulting in inaccurate measurements.

In the prior art, the problem of making good electrical contact between the probe and the microcircuit bonding pad has been solved by attaching a small length of spring wire at the probe tip to make the actual contact with the bonding pad. This approach is often used when a probe is intended to make more than one contact to the microcircuit particularly when the bonding pads to be probed are at differing elevations. The spring wires establish good contact to all bonding pads while their resilience prevents the probe from applying undue pressure to any one bonding pad. Unfortunately the characteristic impedance of a spring wire is usually much different than the impedance of the rest of the probe signal path and at higher frequencies the spring wire can cause unwanted reflections.

Therefore what is needed is a probe providing a path of constant characteristic impedance throughout the length of the probe from the point of connection of external test equipment to a point as close as possible to the microcircuit test point. The probe should also maintain good electrical contact while exerting limited contact pressure.

SUMMARY OF THE INVENTION

In a particular embodiment of the present invention, a microcircuit probe is provided which includes a constant characteristic impedance wave guide terminated at one end by a resiliently supported contact pin and at the other end by a means to couple the wave guide to external test equipment. In one aspect of the invention the probe comprises a constant impedance coaxial wave guide having center and outer conductors separated by a dielectric material. At the end of the probe, the outer conductor and dielectric material extend beyond the inner conductor to provide a cylindrical space at the center of the probe tip of diameter equal to that of the center conductor. A conducting coil spring having the same outer diameter as the inner conductor substantially occupies the cylindrical space at the tip of the probe. One end of the coil spring is attached to the end of the inner conductor while the other spring end is attached to a contact pin of diameter also equal to the diameter of the inner conductor. The contact pin is slidably contained in the cylindrical space at the tip of the probe such that the end of the pin extends slightly beyond the end of the dielectric material and the outer conductor.

As the contact pin engages the bonding pad of a microcircuit, the spring compresses, preventing excess deformation of the bonding pad or contact pin while allowing good electrical contact between the pin and the pad. Since the spring coil and the contact pin have the same diameter as the inner conductor, the characteristic impedance of the probe transmission line is constant throughout the length of the probe nearly to the end of the contact pin.

In another embodiment of the present invention, the probe comprises planar microstrip conductors mounted on the underside of a tapered sheet of resilient dielectric substrate material. The substrate sheet is mounted on the underside of a tapered conducting support member such that the microstrip conductors form wave guides using the support member as a ground plane. The microstrips are terminated with contact pins at the tapered tip of the probe. As the contact pins engage the bonding pads of a microcircuit, the resilient dielectric material compresses between the microstrips and the support member to prevent excess deformation of the contact pins or the bonding pads and to allow for variations in the elevation of the bonding pads.

Accordingly, it is an object of the present invention to provide new and improved microcircuit probes having constant characteristic impedances substantially throughout the lengths of the probes.

It is another object of the present invention to provide a new and improved microcircuit probe for making resilient mechanical contact to a selected point on a microcircuit while limiting the contact pressure applied to such point.

It is a further object of the present invention to provide new and improved microcircuit probes capable of providing simultaneous electrical contact to a plurality of selected points on a microcircuit where such points may be at differing elevations on the surface of the microcircuit.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DESCRIPTION OF THE DRAWINGS

FIG. 1 is a perspective view of the preferred embodiment of the microcircuit probe of the present invention, FIG. 2 is a sectional view of the microcircuit probe of FIG. 1, FIG. 3 is a plan view of the underside of an alternative embodiment of the microcircuit probe according to the present invention.

DETAILED DESCRIPTION

Figure 4:
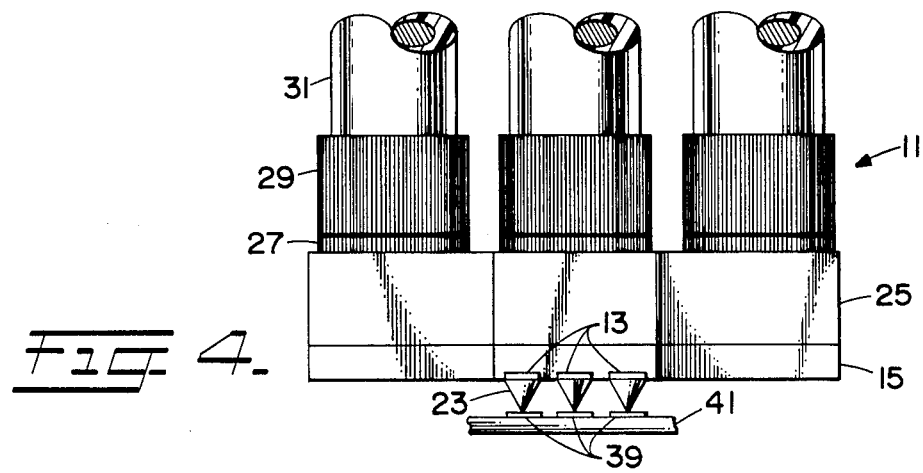
FIG. 4 is a front elevation view of the microcircuit probe of FIG. 3.

Referring to FIG. 1 illustrating a microcircuit probe according to the present invention in perspective view, and to FIG. 2 illustrating the probe of FIG. 1 in sectional view, probe 10 comprises a coaxial wave guide 12 having an outer conductor 14 and an inner conductor 16 separated by dielectric material 18. At tip 20 of probe 10, outer conductor 14 and dielectric material 18 extend beyond end 22 of inner conductor 16 leaving a cylindrical space 36 formed at the center of dielectric material 18 having an inside diameter corresponding to the outside diameter of conductor 16. A coil spring 24 is mounted in space 36 where it is attached at upper end 26 to inner conductor end 22. Spring 24 is constructed of a conducting material and has an outer diameter substantially equal to the outer diameter of inner conductor 16.

Lower end 28 of spring 24 is attached to and surrounds reduced diameter cylindrical extension 30 of pin 32 mounted in the end of space 36. Extension 30 has a diameter substantially equal to the inner diameter of spring 24 such that spring 24 tightly grips extension 30. Pin 32 is also constructed of a conducting material and has a cylindrical lower portion 34 having nearly the same diameter as inner conductor 16 for closely but slidably fitting within space 36. Pin 32 is tapered at lower end 38 to allow selective electrical contact, for example with a small bonding pad 40 on microcircuit device 42.

Probe 10 is attached to coaxial cable 44 by coupling means 46 suitably comprising connectors 48 and 50. Coaxial cable 44, comprising inner conductor 52 and outer conductor 54 separated by dielectric material 56 and surrounded by jacket 58, may be coupled at a distant end (not shown) to appropriate test equipment through a suitable connector.

Probe 10 has the same physical arrangement of inner and outer conductors as coaxial cable 44 from the probe termination in connector 46 down to end 22 of inner conductor 16 and therefore probe 10 has the same characteristic impedance as cable 44 from connector 46 to conductor end 22. With connector 46 being selected to maintain a constant characteristic impedance connection between probe 10 and cable 44, a constant characteristic impedance signal path extends from the test equipment to end 22 of inner conductor 16.

Spring 24 and pin 32, acting as inner conductors and having outer diameters equal to that of conductor 16, together with an extension of outer conductor 14 and dielectric 18 at probe tip 20, continue the spatial relation of inner and outer conductors from end 22 of conductor 16 through the end of tip 20 proximate lower portion 34 of the pin 32 where the outer conductor 14 surrounds at least part of the length of lower portion 34, particularly when the spring 24 is compressed. Therefore the constant characteristic impedance signal path of probe 10 is extended nearly to bonding pad 40 of device 42.

As probe 10 is lowered, pin 32 engages bonding pad 40 thereby compressing spring 24 to prevent undue deformation of bonding pad 40 or pin 32 while providing enough pressure between pad 40 and pin 32 to obtain good electrical contact. Spring 24 is tightly coiled to closely approximate a solid conductor but is provided with enough space between coils to allow for adequate compression during probe use.

When a connection between outer conductor 14 and a second bonding pad 64 on microcircuit device 42 is also desired, probe 10 may additionally include a conducting sleeve 60 slidably fitting about outer conductor 14 at tip 20 of probe 10. A second coil spring 68 is positioned around conductor 14 between rim 66 attached to conductor 14 and the upper end of sleeve 60 for urging the sleeve downwardly. A tapered outer conductor probe pin 62, extending slightly beyond tip 20 of probe 10, is attached to the lower periphery of sleeve 60 so that as probe 10 is lowered, pin 62 engages bonding pad 64. Spring 68 compresses to limit contact pressure between pin 62 and pad 64. Since sleeve 60, spring 68 and rim 66 are outside outer conductor 14, these items do not substantially affect the characteristic impedance of the probe wave guide.

Figure 5:
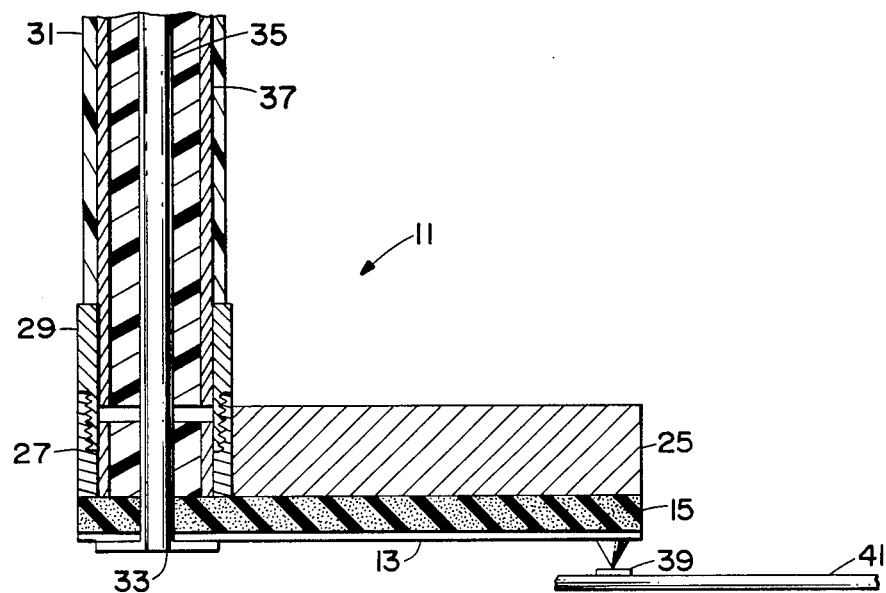
FIG. 5 is a sectional view of the alternative embodiment of the microcircuit probe of FIG. 3.

Referring now to an alternative embodiment of the present invention depicted in FIGS. 3, 4 and 5, microcircuit probe 11 comprises microstrip signal conductors 13 mounted on the underside of tapered board 15 as shown specifically in FIG. 3. Board 15 is formed of a resilient dielectric material suitably comprising silicon rubber. Dielectric board 15 is mounted along the underside of conducting support member 25. Support member 25, suitably formed of steel, has connectors 27 located at one end for receiving connectors 29 at the ends of coaxial cables 31 leading to test equipment (not shown). Conductor stub 33, passing through board 15, is bonded to a microstrip 13 and connects inner conductor 35 of coaxial cable 31 to a microstrip conductor 13. Outer conductor 37 of coaxial cable 31 is electrically connected to support member 25 through connectors 27 and 29.

Support member 25 acting as a ground plane, together with signal conductors 13, form three wave guides for conducting signals between contact pins 23 mounted on conductors 13 at the tip of probe 11 and plural conductor stubs 33. The thickness of board 15 and the widths of conductors 13 are such that the three wave guides have the same characteristic impedance as coaxial cables 31. To provide continuity of characteristic impedance through connectors 27 and 29, stubs 33 are of the same diameter as inner conductors 35 of cables 31 and the inner diameters of connectors 27 and 29 are the same as the inner diameter of outer conductors 37 of cables 31. Therefore, the characteristic impedance of each cable 31 is extended through connectors 29 and 27 to board 15 and along the length of conductors 13 from stub 33 to pins 23.

In FIGS. 4 and 5, probe 11 is depicted with pins 23 engaging bonding pads 39 of microcircuit 41. As pins 23 are lowered onto pads 39, resilient dielectric material 15, acting as a spring, compresses, thereby limiting contact pressure on pins 23 and pads 39 to prevent excessive deformation of the pins and pads and allowing pin contact with all pads even though some pads may be lower in elevation than others.

It should be noted that while three conductors 13 are shown in FIG. 3, with pins 23 in substantial alignment, an alternative embodiment of the present invention may comprise a larger or smaller number of conductors 13 arranged in any suitable fashion on board 15 to provide the number and juxtaposition of contact pins 23 necessary to engage any reasonable number and arrangement of bonding pads 39 on a microcircuit device 41.

Thus in the preferred and alternative embodiments, the present invention provides a microcircuit probe having at least one wave guide of constant characteristic impedance from the point of connection of an external signal conductor to a spring mounted pin at the tip of the probe, the pin providing a resilient contact to a selected point on a device being tested. While preferred and alternative embodiments of the present invention have been shown and described, it will be apparent to those skilled in the art that many changes and modifications may be made without departing from the invention in its broader aspects. The appended claims are therefore intended to cover all such changes and modifications as fall within the true scope and spirit of the invention

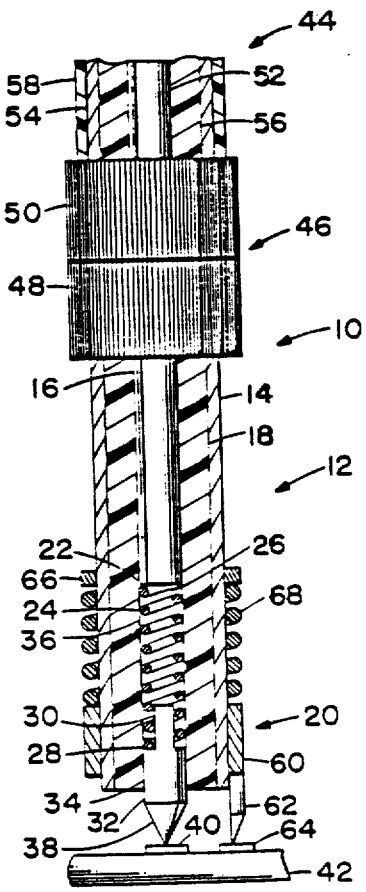

We claim:

1. A process for coupling electrical test equipment to a selected point in an electrical device, comprising:

a coaxial waveguide having an inner conductor, a dielectric, and an outer conductor, the inner conductor and outer conductor being separated by the dielectric, the dielectric having a constant thickness, and the dielectric and the outer conductor extending beyond the inner conductor;

means for coupling the coaxial waveguide to the test equipment;

a rigid conductive pin for contacting the selected point, the pin having a constant outer dimension which is the same as the outer dimension of the inner conductor; and means for connecting the pin to the inner conductor, the connecting means being conductive and resilient and having an outer dimension which is the same as the outer dimension of the inner conductor, the connecting means and the rigid pin forming an extension of the inner conductor within the extension of the dielectric and the outer conductor so that the inner conductor and the extension of the inner conductor maintain a constant outer dimension to provide an essentially constant characteristic impedance over the length of the probe.

2. A probe as recited in claim 1 wherein the connecting means is a coil spring.

3. A probe for coupling electrical test equipment to a signal point and a ground point in an electrical device, comprising:

a coaxial waveguide having an inner conductor, a dielectric, and an outer conductor, the inner conductor and outer conductor being separated by the dielectric, the dielectric having a constant thickness, and the dielectric and the outer conductor extending beyond the inner conductor;

means for coupling the coaxial waveguide to the test equipment;

a rigid conductive signal pin for contacting the signal point, the signal pin having a constant outer dimension which is the same as the outer dimension of the inner conductor;

a rigid conductive ground pin for contacting the ground point, the ground pin being in electrical contact with the outer conductor; and means for connecting the signal pin to the inner conductor, the connecting means being conductive and resilient and having an outer dimension which is the same as the outer dimension of the inner conductor, the connecting means and the signal pin forming an extension of the inner conductor within the extension of the dielectric and the outer conductor so that the inner conductor and the extension maintain a constant outer dimension to provide an essentially constant characteristic impedance over the length of the probe.

4. A probe as recited in claim 3 wherein the connecting means is a coil spring.

* * * * *

UNITED STATES PATENT AND TRADEMARK OFFICE
CERTIFICATE OF CORRECTION

PATENT NO. : 4,740,746  Page 1 of 2

DATED : April 26, 1988

INVENTOR(S) : Ira G. Pollock and Jon C. Manor

It is certified that error appears in the above—identified patent and that said Letters Patent is hereby corrected as shown below:

The Title Page should be deleted to appear as per attached Title Page.

Claim 1, Column 5, line 7, reads "process" should be --probe--.

Signed and Sealed this

Twenty-seventh Day of September, 1988

Attest:

DONALD J. QUIGG

*Attesting Officer*   *Commissioner of Patents and Trademarks*

United States Patent [19]

Pollock et al.

[11] Patent Number: 4,740,746
[45] Date of Patent: Apr. 26, 1988

[54] CONTROLLED IMPEDANCE MICROCIRCUIT PROBE

[75] Inventors: Ira G. Pollock, Beaverton; Jon C. Manor, Aloha, both of Oreg.

[73] Assignee: Tektronix, Inc., Beaverton, Oreg.

[21] Appl. No.: 18,729

[22] Filed: Feb. 24, 1987

Related U.S. Application Data

[63] Continuation of Ser. No. 670,090, Nov. 13, 1984, abandoned.

[51] Int. Cl.$^4$ .................. G01R 1/06; G01R 31/02
[52] U.S. Cl. .................. 324/158 P; 324/72.5; 324/73 PC; 324/158 F
[58] Field of Search .......... 324/158 F, 158 P, 73 PC, 324/72.5, 149, 158 R; 339/108 TP; 439/476

[56] References Cited

U.S. PATENT DOCUMENTS

| | | | |
|---|---|---|---|
| 4,116,523 | 9/1978 | Coberly et al. | 324/158 P |
| 4,355,857 | 10/1982 | Hayward | 339/177 R |
| 4,383,217 | 5/1983 | Shiell | 324/158 F |
| 4,593,243 | 6/1986 | Lao et al. | 324/158 F |
| 4,636,722 | 1/1987 | Ardezzone | 324/158 F |

FOREIGN PATENT DOCUMENTS

| | | |
|---|---|---|
| 0137370 | 4/1985 | European Pat. Off. |
| 2924262 | 2/1981 | Fed. Rep. of Germany ... 324/158 P |
| 2066590 | 7/1981 | United Kingdom |
| 2113483 | 8/1983 | United Kingdom |

OTHER PUBLICATIONS

"Tester Contact Method", by Kappel et al., IBM Tech. Disc. Bull., 2/79, vol. 21, #9, p. 3742.
"Gigahertz Probl. Assembly", by Beers, IBM Tech. Disc. Bull., 9/72, vol. 15, #4, p. 1144.
"A Coaxial Test Probe", by Abbatecola et al., IBM Tech. Disc. Bull., 12/69, vol 12, #7, p. 1061.
"Probe for MOS Measurements", by Hoepstra, IBM Tech. Disc. Bull., 3/71, vol. 13, #10, p. 2981.
"Probe Head for Tester", Zak et al., Aug. 1971, IBM Tech. Discl. Bull., vol 14, #3, p. 756.
"High Performance Contactor", Bove, Feb. 1976, IBM Tech. Disc. Bull., vol. 18, #9, p. 2883.

Primary Examiner—Reinhard J. Eisenzopf
Assistant Examiner—W. Burns
Attorney, Agent, or Firm—John P. Dellett; Francis I. Gray; Boulden G. Griffith

[57] ABSTRACT

A probe for coupling electrical test equipment to a selected point of an electrical device has a resiliently supported rigid pin for contacting the selected point and a wave guide of substantially constant characteristic impedance coupling the test equipment to the pin.

4 Claims, 2 Drawing Sheets